United States Patent
Li (10) Patent No.: US 10,177,146 B2
(45) Date of Patent: Jan. 8, 2019

(54) SEMICONDUCTOR STRUCTURE WITH IMPROVED PUNCH-THROUGH AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/726,644

(22) Filed: Oct. 6, 2017

(65) Prior Publication Data
US 2018/0102363 A1 Apr. 12, 2018

(30) Foreign Application Priority Data
Oct. 10, 2016 (CN) .......................... 2016 1 0885805

(51) Int. Cl.
*H01L 27/088* (2006.01)
*H01L 21/8238* (2006.01)
(Continued)

(52) U.S. Cl.
CPC ...... *H01L 27/0886* (2013.01); *H01L 21/8238* (2013.01); *H01L 21/823814* (2013.01);
(Continued)

(58) Field of Classification Search
None
See application file for complete search history.

(56) References Cited

U.S. PATENT DOCUMENTS

2010/0237419 A1* 9/2010 Yang .................. H01L 27/0207
257/368
2013/0196478 A1* 8/2013 Chang ............... H01L 29/66795
438/283

(Continued)

OTHER PUBLICATIONS

The European Patent Office (EPO) The Extended European Search Report for 17195405.0 dated Feb. 8, 2018 12 Pages.

*Primary Examiner* — Eduardo A Rodela
*Assistant Examiner* — Nilufa Rahim
(74) *Attorney, Agent, or Firm* — Anova Law Group, PLLC (57) ABSTRACT

A semiconductor structure and a fabrication method are provided. A fabrication method includes providing a plurality of fins on a substrate including an NMOS region and a PMOS region adjacent to the NMOS region; forming an N-type well in the PMOS region and a P-type well in the NMOS region of the substrate; forming a protective sidewall to cover an upper portion of a sidewall surface of each fin in each of the NMOS region and PMOS region and to expose a lower portion of the sidewall surface of each fin; removing a partial width of the lower portion of the fin using the protective sidewall as an etch mask; removing the protective sidewall; and forming an isolation structure at least by oxidizing the remaining lower portion of the fin and having a top surface lower than the neighboring upper portions of the fins.

20 Claims, 6 Drawing Sheets

(51) Int. Cl.
*H01L 21/84* (2006.01)
*H01L 27/092* (2006.01)
*H01L 27/12* (2006.01)
*H01L 29/66* (2006.01)
*H01L 21/027* (2006.01)
*H01L 21/311* (2006.01)
*H01L 27/11* (2006.01)

(52) U.S. Cl.
CPC ........ *H01L 21/823821* (2013.01); *H01L 21/823864* (2013.01); *H01L 21/823878* (2013.01); *H01L 21/823892* (2013.01); *H01L 21/84* (2013.01); *H01L 21/845* (2013.01); *H01L 27/092* (2013.01); *H01L 27/0924* (2013.01); *H01L 27/12* (2013.01); *H01L 27/1207* (2013.01); *H01L 27/1211* (2013.01); *H01L 21/0276* (2013.01); *H01L 21/31116* (2013.01); *H01L 21/31144* (2013.01); *H01L 27/1104* (2013.01); *H01L 29/66818* (2013.01)

(56) References Cited

U.S. PATENT DOCUMENTS

| | | | |
|---|---|---|---|
| 2014/0227846 A1* | 8/2014 | Liaw | H01L 29/66795 438/283 |
| 2015/0102409 A1 | 4/2015 | Cheng et al. | |
| 2015/0102411 A1 | 4/2015 | Ching et al. | |
| 2015/0200128 A1 | 7/2015 | Jacob et al. | |
| 2015/0203753 A1* | 7/2015 | Andreas | C09K 13/00 438/753 |
| 2015/0243755 A1 | 8/2015 | Cheng et al. | |
| 2015/0255542 A1* | 9/2015 | Cai | H01L 29/1054 257/401 |
| 2015/0268189 A1 | 9/2015 | Rigante et al. | |
| 2016/0099352 A1 | 4/2016 | Lee et al. | |
| 2016/0225659 A1 | 8/2016 | Jacob et al. | |
| 2016/0336347 A1* | 11/2016 | Cheng | H01L 27/1211 |
| 2017/0229351 A1 | 8/2017 | Fung | H01L 27/0924 |
| 2017/0358663 A1* | 12/2017 | Li | H01L 29/66795 |

* cited by examiner

SEMICONDUCTOR STRUCTURE WITH IMPROVED PUNCH-THROUGH AND FABRICATION METHOD THEREOF

CROSS-REFERENCES TO RELATED APPLICATIONS

This application claims the priority of Chinese patent application No. 201610885805.8, filed on Oct. 10, 2016, the entirety of which is incorporated herein by reference.

FIELD OF THE DISCLOSURE

The present disclosure generally relates to the field of semiconductors and, more particularly, relates to a semiconductor structure and a fabrication method thereof.

BACKGROUND

With the development of ultra-large-scale integrated circuits in semiconductor manufacturing, the feature size of integrated circuits continues to decrease. In order to adapt to a reduced feature size, the channel length of metal-oxide semiconductor field-effect transistor (MOSFETs) is also continuously shortened. However, when the channel length of devices is shortened, the distance between the source and drain of devices is also shortened. Therefore, the controlling capability of gate to channel is degraded and the pinch off of channel by the gate voltage becomes more difficult, causing a subthreshold leakage phenomenon. That is, the short-channel effects (SCEs) can occur more easily.

In order to better adapt to the reduced feature size, semiconductor technologies are gradually developed from the planar MOSFET to the more efficient three-dimensional transistors, such as fin-type field effect transistor (FinFET). In a FinFET, the gate can control the ultrathin portion (fin) from both sides. Compared to the planar MOSFET, in FinFET the controlling capability of gate to channel is much stronger and the short-channel effects can be substantially suppressed. Further, the FinFET is more compatible to current integrated circuit manufacturing technologies than other devices.

However, the electrical properties of the semiconductor devices formed by current technologies are yet to be improved. The disclosed device structures and methods are directed to solve one or more problems set forth above and other problems.

BRIEF SUMMARY OF THE DISCLOSURE

One aspect of the present disclosure includes a method for fabricating a semiconductor structure. The fabrication method includes providing a substrate including an NMOS region and a PMOS region adjacent to the NMOS region, and a plurality of fins on the substrate; forming an N-type well in the PMOS region of the substrate and a P-type well in the NMOS region of the substrate; forming a protective sidewall to cover an upper portion of a sidewall surface of each fin in each of the NMOS region and PMOS region and to expose a lower portion of the sidewall surface of each fin. The method further includes removing a partial width of the lower portion of the fin along a direction perpendicular to a sidewall of the fin using the protective sidewall as an etch mask; removing the protective sidewall; forming an isolation structure at least by oxidizing the remaining lower portion of the fin, such that the isolation structure is formed on the substrate, under and between neighboring upper portions of the fins, and having a top surface lower than the neighboring upper portions of the fins; forming a gate structure on the fins; forming a first source/drain doped region within the fin on both sides of the gate structure in the PMOS region and a second source/drain doped region within each fin on both sides of the gate structure in the NMOS region.

Another aspect of the present disclosure includes a semiconductor structure. The semiconductor structure includes a substrate including an NMOS region and a PMOS region adjacent to the NMOS region; a plurality of fins on the substrate; an N-type well in the PMOS region of the substrate and a P-type well in the NMOS region of the substrate; an isolation structure on the substrate; a gate structure covering a portion of the top surface and sidewall surface of the fins; and a first source/drain doped region within the fin on both sides of the gate structure in the PMOS region and a second source/drain doped region within each fin on both sides of the gate structure in the NMOS region.

Other aspects of the present disclosure can be understood by those skilled in the art in light of the description, the claims, and the drawings of the present disclosure.

DETAILED DESCRIPTION

Reference will now be made in detail to the exemplary embodiments of the disclosure, which are illustrated in the accompanying drawings. Wherever possible, the same reference numbers will be used throughout the drawings to refer to the same or similar parts.

With the development of storage technology, there are various types of semiconductor memories including, for example, static random access memory (SRAM), dynamic random access memory (DRAM), erasable programmable read-only memory (EPROM), electrically erasable programmable read-only (EEPROM), and flash memory. Among these semiconductor memories, SRAM has received more and more attentions because of the advantages of low power consumption and fast processing speed. However, the electrical performance of the SRAM and the overall performance of devices still need to be improved.

Figure 1:
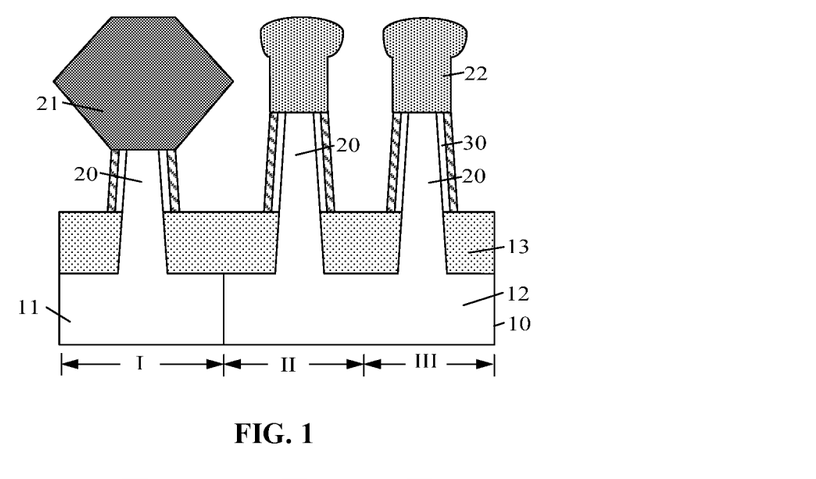
FIG. 1 illustrates a schematic cross-section view of an exemplary semiconductor structure consistent with the disclosed embodiments.

FIG. 1 illustrates a schematic cross-section view of a static random access memory (SRAM), which includes a pull-up (PU) transistor, a pull-down (PD) transistor, and a pass gate (PG) transistor.

As shown in FIG. 1, the semiconductor structure includes a substrate 10 and a plurality of discrete fins 20 on the substrate 10. The substrate 10 includes a PU transistor region I, a PD transistor region II adjacent to the PU transistor region I, and a PG transistor region III adjacent to the PD transistor region II. The semiconductor structure also includes an N-type well region 11 in the PU transistor region I of the substrate 10, a P-type well region 12 in the PD transistor region II and the PG transistor region III of the substrate 10, an isolation structure 13 on the substrate 10 between the neighboring fins 20, an oxide layer 30 across the fins 20 to cover part of the top surface and sidewall surface of the fins 20. A P-type source/drain doped region 21 is formed on both sides of the oxide layer 30 of the fin 20 in the PU transistor region I, and an N-type source/drain doped region 22 is formed on both sides of the gate structure 30 of the fin 20 in the PD transistor region II and on both sides of the oxide layer 30 of the fin 20 in the PG transistor region III.

Because the substrate 10 and the fins 20 are formed by etching an initial substrate, that is, the substrate 10 and the fins 20 are connected, punch-through may occur between the P-type source/drain doped region 21 and the P-type well region 12 via the fin 20 and the N-type well region 11. Similarly, punch-through may occur between the N-type source/drain doped region 22 and the N-type well region 11 via the fin 20 and the P-type well region 12. Because the PU transistor region I is adjacent to the PD transistor region II, the N-type source/drain doped region 22 of the PD transistor also tends to punch through with the N-type well region 11. Therefore, the isolation effect between the P-type source/drain doped region 21 of the PU transistor and the P-type well region 12, and the isolation effect between the N-type source/drain doped region 22 of the PD transistor and the N-type well region 11 need to be improved.

The present disclosure provides semiconductor structures and fabrication methods thereof. According to the disclosed semiconductor structures and methods, the punch-through problem and other problems may be overcome by, for example, forming a protective sidewall.

A protective sidewall may be formed partially on the sidewall surface of a fin. For example, the protective sidewall may expose a first region (e.g., the lower portion) of the fins and cover a second region (e.g., an upper portion) of the fins. Using the protective sidewall as a mask, partial width of the first region of the fin is removed along a direction perpendicular to the sidewall of the fin. When subsequently forming the isolation structure on the substrate between the neighboring fins, the isolation structure is formed in an oxygen-containing atmosphere by substantially oxidizing the remaining first region of the fin to make the oxidized first region as a portion of the isolation structure. Thus, the second region of the fins and the substrate can be separated by the isolation structure, that is, the second region of the fins and the N-type well region, and the second region of the fins and the P-type well region are separated by the isolation structure, respectively. After forming the first source/drain doped region on both sides of the gate structure of the fin in the PMOS region and forming the second source/drain doped region on both sides of the gate structure of the fins in the NMOS region, the isolation structure can prevent punch-through between the first source/drain doped region and the P-type well region across the N-type well region, and can prevent punch-through between the second source/drain doped region and the N-type well region across the P-type well region. That is, the isolation effect between the first source/drain doped region and the P-type well region and the isolation effect between the second source/drain doped region and the N-type well region are improved, so that the electrical performance of semiconductor devices can be improved.

Figure 15:
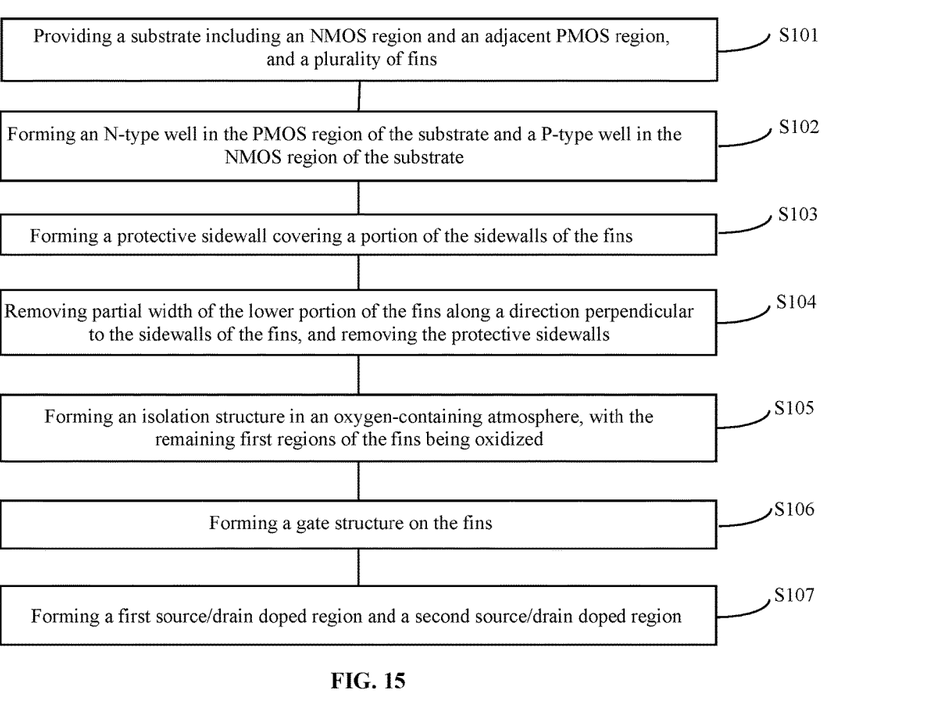
FIG. 15 illustrates an exemplary fabricating process of a semiconductor structure consistent with the disclosed embodiments.

FIG. 15 illustrates an exemplary fabrication process of a semiconductor structure consistent with the disclosed embodiments; and FIGS. 2-13 illustrate semiconductor structures corresponding to certain stages of the exemplary fabrication process consistent with the disclosed embodiments.

Figure 2:
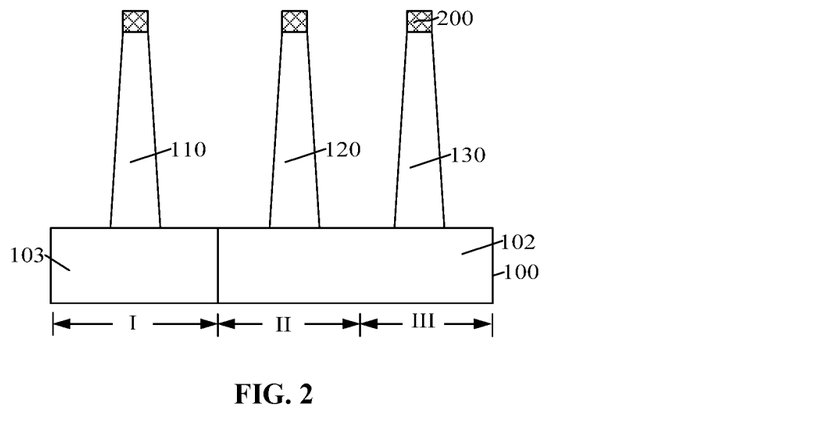
FIGS. 2-13 illustrate schematic cross-section views of an exemplary semiconductor structure corresponding to certain stages of a fabrication process consistent with the disclosed embodiments.

As shown in FIG. 15, at the beginning of the fabrication process, a substrate and a plurality of discrete fins are provided (S101). FIG. 2 illustrates a corresponding semiconductor structure.

As shown in FIG. 2, a substrate 100 and a plurality of discrete fins (not shown) on the substrate 100 are provided. The substrate 100 includes an NMOS region (not shown) and a PMOS region I adjacent to the NMOS region, and provides a processing platform for the subsequent formation of the semiconductor structure.

In one embodiment, the substrate 100 may be used to form an SRAM device. The NMOS region of the substrate 100 provides a processing platform for the subsequent formation of a PD transistor and a PG transistor, and the PMOS region I of the substrate 100 provides a processing platform for the subsequent formation of a PU transistor.

For example, the NMOS region of the substrate 100 includes a first NMOS region II for forming a PD transistor, and a second NMOS region III for forming a PG transistor, where the first NMOS region II is located between the PMOS region I and the second NMOS region III.

Accordingly, the fin on the PMOS region of the substrate 100 is the first fin 110, the fin on the first NMOS region II of the substrate 100 is the second fin 120, and the fin on the second NMOS region III of the substrate 100 is the third fin 130.

In some embodiments, the substrate 100 can be made of silicon. In other embodiments, the substrate may be made of germanium, silicon germanium, silicon carbide, gallium arsenide and/or indium gallium. In still other embodiments, the substrate may be a silicon on insulator (SOI) substrate or a germanium-on-insulator (GeOI) substrate.

The fins and the substrate 100 can be made of the same material. In one embodiment, the fins are made of silicon, that is, the first fin 110, the second fin 120, and the third fin 130 are made of silicon. In other embodiments, the fins may be made of any other suitable materials including, for example, germanium, silicon germanium, silicon carbide, gallium arsenide, and/or indium gallium.

For example, the substrate 100 and the fins may be formed by: providing an initial substrate; forming a patterned first hard mask layer 200 on the initial substrate surface; using the first hard mask layer 200 as a mask to etch the initial substrate to form the substrate 100 and the fins protruding from the surface of the substrate 100.

In one embodiment, the top size of the fins is smaller than the bottom size. In other embodiments, the sidewalls of the fins may be perpendicular to the substrate surface, that is, the top size of the fins is equal to the bottom size.

In one embodiment, after forming the substrate 100 and the fins, the first hard mask layer 200 on top of the fins is retained. The first hard mask layer 200 may be made of silicon nitride. During the subsequent planarization process, the top surface of the first hard mask layer 200 can be used to define a stop position of the planarization process and to protect the top of the fins.

Returning to FIG. 15, after providing the substrate and the fins, an N-type well region may be formed in the PMOS region and a P-type well region may be formed in the NMOS region of the substrate (S102). FIG. 2 illustrates a corresponding semiconductor structure.

As shown in FIG. 2, an N-type well region 103 is formed in the PMOS region I of the substrate 100, and a P-type well region 102 is formed in the NMOS region of the substrate 100.

In one embodiment, the N-type well region 103 is formed by subjecting the PMOS region I of the substrate 100 to an N-type ion doping process, and the N-type ions may include phosphorus ions or arsenic ions. The P-type well region 102 is formed by subjecting the NMOS region of the substrate 100 to a P-type ion doping process, and the P-type ions may include boron ions or indium ions.

The NMOS region of the substrate 100 includes a first NMOS region II and a second NMOS region III. Correspondingly, when forming the P-type well region 102, the P-type well region 102 is formed in the first NMOS region II and the second NMOS region III of the substrate 100.

In one embodiment, the N-type well region 103 and the P-type well region 102 are formed after forming the substrate 100 and the fins. In other embodiments, the N-type well region and the P-type well region may be formed before forming the substrate and the fins by subjecting the PMOS region of the initial substrate to an N-type ion doping process and subjecting the NMOS region of the initial substrate to a P-type ion doping process.

Figure 3:
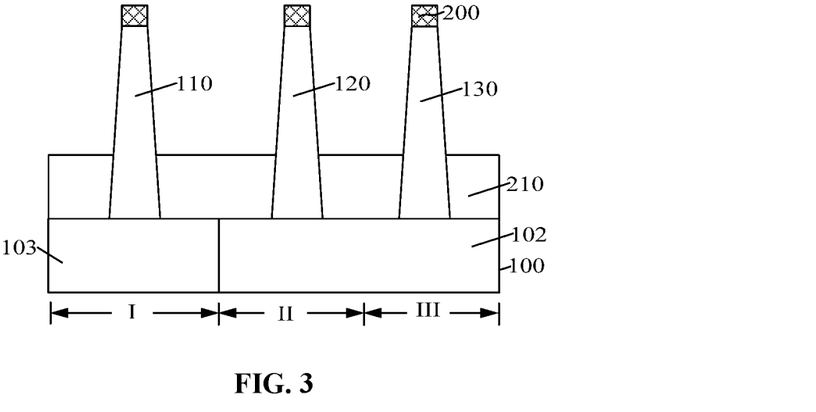
Figure 4:
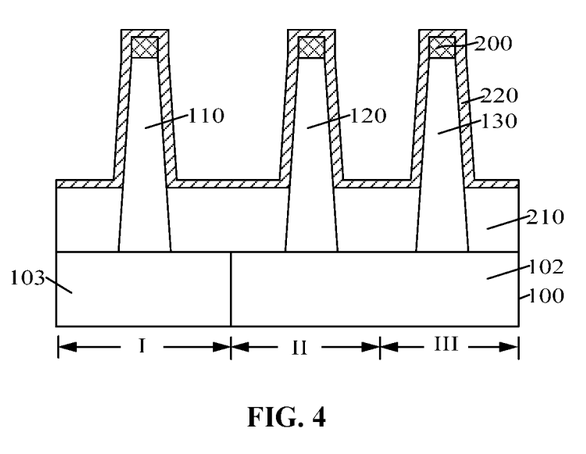
Figure 5:
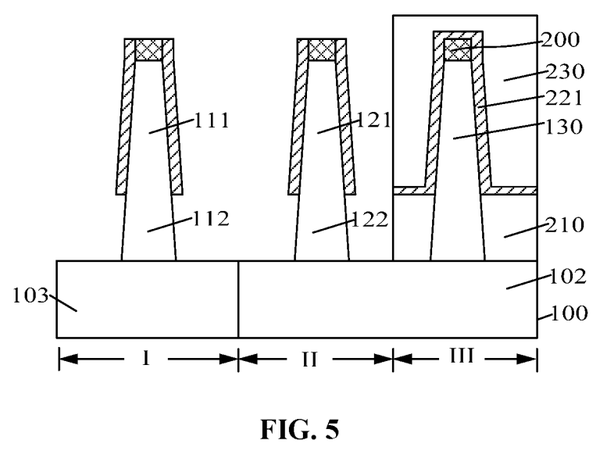

Returning to FIG. 15, a protective sidewall covering a portion of the sidewall surfaces of the fins is formed (S103). FIGS. 3-5 illustrates corresponding semiconductor structures for forming a protective sidewall 221. As shown in FIG. 5, the fin portions exposed by the protective sidewalls 221 are the first regions of the fins and the fin portions covered by the protective sidewalls 221 are the second region of the fins.

The protective sidewall 221 can protect a portion of the fin. In the subsequent etching process, the fin portions covered by the protective sidewalls 221 are protected from being etched away, and the fin portions exposed by the protective sidewalls 221 may be etched.

The protective sidewalls 221 and the fins may be made of different materials. In the subsequent etching process, the etching rate of the fins is much greater than the etching rate of the protective sidewalls 221, so that the second regions of the fins that are covered by the protective sidewalls 221 can be protected from being etched. In one embodiment, the protective sidewall 221 is made of silicon nitride. In other embodiments, the protective sidewall 211 may be made of silicon carbide, silicon carbonitride, silicon oxynitride, silicon oxynitride, boron nitride, and/or boronitride.

The protective sidewall 221 should not be too thick or too thin. If the thickness of the protective sidewall is too small, the protective effect of the protective sidewall 221 on the second region of the fins is not very effective in the subsequent etching process, and the second region of the fins is susceptible to etching loss. If the thickness of the protective sidewall 221 is too large, it is likely more difficult to remove the protection sidewall 221 in the subsequent process. In one embodiment, the thickness of the protective sidewall 221 is in a range of approximately 10 Å~60 Å.

For example, a protective sidewall 221 covering the sidewall surface of the fins is formed by the following procedures: forming a filling layer 210 (FIG. 3) on the substrate 100 between the neighboring fins with the filling layer 210 covering a surface portion of the sidewalls of the fins; forming a protective film 220 covering the top and sidewalls of the fins (FIG. 4), and the protective film 220 also covers the top of the filling layer 210; forming a patterned layer 230 on the protective film 220 in the second NMOS region III; using the patterned layer 230 as a mask to remove a portion of the protective film 220 that are on the top surface of the first fin 110, the second fin 120, and the filling layer 210 (as shown in FIG. 4), with the remaining protective film 220 forming the protective sidewalls 221; and after forming the protective sidewalls 221, removing the exposed filling layer 210.

In one embodiment, the first hard mask layer 200 is formed on the top surface of the fin. During the process to remove the portions of the protective film 220 from the top surfaces of the first fin 110, the second fin 120 and the filling layer 210, the portions of the protective film 220 on top of the first hard mask layers 200 and on top of the filling layer 210 are removed.

In one embodiment, the filling layer 210 may be made of a bottom anti-reflective coating (BARC) material. The filling layer 210 is formed by the following procedures: forming a filling material layer on the substrate 100 between the neighboring fins using a spin coating technique with the top surface of the filling material layer higher than the first hard mask layer 200; removing the filling material layer that is higher than the first hard mask layer 200 using a chemical mechanical polishing (CMP) technique; etching back a portion of the remaining filling material layer to form the filling layer 210. In other embodiments, the filling layer may be made of an organic dielectric layer (ODL) material or a deep ultraviolet light absorbing oxide (DUO) material. The DUO material may be made of a siloxane polymer material, including $CH_3$—SiOX, Si—OH, $SiOH_3$, etc.

In one embodiment, the exposed filling layer 210 may be removed by ashing to reduce the damage to the substrate 100 and to improve the performance of the formed semiconductor structure.

In one embodiment, the patterned layer 230 may be made of a photoresist. The patterned layer 230 is formed on the protective film 220 in the second NMOS region III by an exposure development technique.

In one embodiment, the protective film 220 is formed by an atomic layer deposition technique. For example, the protective film 220 may be made of silicon nitride. The processing parameters of the atomic layer deposition technique include: the precursor to be introduced into the atomic layer deposition chamber is a precursor containing Si and N; the processing temperature is in the range of approximately 400° C.~600° C.; the processing pressure is in the range of approximately 1 mTorr~10 mTorr; the total precursor gas flow is in the range of approximately 1500 sccm~4000 sccm, and the deposition is repeatedly performed by approximately 15~100 times.

If the processing temperature is below 400° C., the deposition rate per deposition process is too low, resulting in a thin protective film 220 or a need to increase the processing time in order to reach the target thickness, and the formation efficiency of the protective film 220 is decreased. If the processing temperature is above 600° C., thermal decomposition of the precursor may occur, therefore introducing a chemical vapor deposition-like phenomenon and affecting the purity and step coverage of the protective film 220. The quality of the formed protective film 220 is reduced.

By setting the processing temperature, the chamber pressure, the total gas flow rate, and the number of deposition times within a suitable range, high purity and good step coverage of the formed protective film 220 may be ensured. The formed protective film 220 may have a desired thickness as designed to further enhance the quality of the formed protective film 220.

In one embodiment, a plasma dry etching technique is used to remove the protective film 220 from the top surface of the first hard mask layer 200 and the filling layer 210 to form the protective sidewalls 221. After forming the protective sidewalls 221, the portion of the first fin 110 exposed by the protective sidewall 221 is the first region 112 of the first fin (FIG. 5), and the unexposed portion of the first fin 110 is the second region 111 of the first fin; the portion of the second fin 120 exposed by the protective sidewall 221 is the first region 122 of the second fin (FIG. 5), and the unexposed portion of the second fin 120 is the second region 121 of the second fin 120 (FIG. 5).

Because the second NMOS region III is located on the other side of the first NMOS region II away from the PMOS region I, after forming the source/drain doped region, punch-through is unlikely to occur between the source/drain doped region of the PU transistor and the N-type well region 103. In one embodiment, a patterned layer 230 is formed on the protective film 220 in the second NMOS region III so as to retain the filling layer 210 in the second NMOS region. In the subsequent etching process, the patterned layer 230, the protective sidewall 221, and the filling layer 210 in the second NMOS region III can protect the third fin 130 from being etched.

Figure 6:
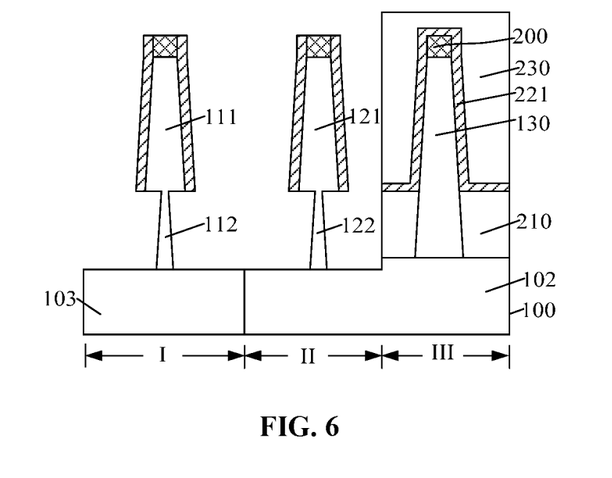
Figure 7:
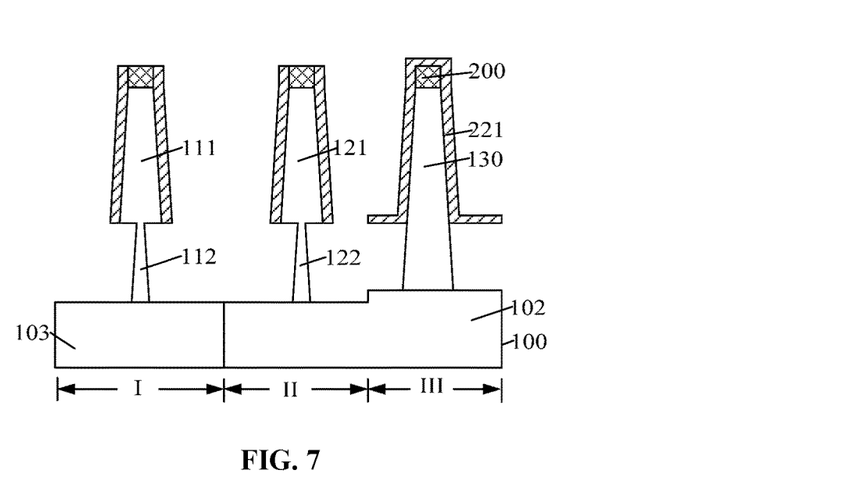

Returning to FIG. 15, the fabrication method further includes removing partial width of the first regions of the fins along a direction perpendicular to the sidewalls of the fins and removing the protective sidewalls (S104). FIG. 6 illustrates a corresponding semiconductor structure.

As shown in FIG. 6, partial width of the first regions (e.g., lower portions) of the fins is removed along the direction perpendicular to the sidewalls of the fins so as to oxidize the remaining first regions of the fins in the subsequent step of forming the isolation structure and to convert the remaining first regions of the fins into the isolation material and form a portion of the isolation structure, so that the isolation between the second region (e.g., upper portion) of the fins and the substrate 100 is achieved.

Therefore, the height of the first region of the fins should neither be too small nor too large. If the height of the first region of the fins is too small, after removing partial width of the first region of the fins, it is difficult for the remaining first region of the fins to support the second region of the fins at the top of the first region of the fins, and therefore the second region of the fins is likely to collapse. Further, after forming the isolation structure, the thickness of the isolation material that is converted from the first region of the fins is too small, the isolation effect of the isolation material on the second region of the fins and the substrate is not very effective; if the height of the first region of the fins is too large, the height of the second region of the fins is correspondingly too small. Since a gate structure will be formed subsequently in the second region of the fins and a source/drain doped region will be formed in the second region of the fins on both sides of the gate structure, the electrical performance of the semiconductor device will be adversely affected.

In one embodiment, the ratio between the height of the first region (e.g., lower portions) of the fins and the total height of the fins may be in a range of approximately 20%~30%. That is, the ratio between the first region 112 of the first fin to the total height of the first fin 110 may be in an range of 20%~30%, and the ratio between the first region 122 of the second fin and the total height of the second fin 120 may be in a range of 20%~30%.

As shown in FIG. 6, using the protective sidewall 221 as a mask, the first region of the fins is partially removed along a direction perpendicular to the sidewalls of the fins.

By removing partial width of the first region of the fins, the width of the first region of the fins becomes smaller along the direction perpendicular to the sidewalls of the fins, and therefore when subsequently forming the isolation structure in an oxygen-containing atmosphere, the remaining first region of the fins can be fully oxidized. That is, all of the first region of the fins made of silicon can be fully oxidized into silicon oxide when subsequently forming the isolation structure. The silicon oxide, as part of the isolation structure, can isolate the second region of the fins from the substrate 100.

For example, removing partial width of the first region of the fins along a direction perpendicular to the sidewalls of the fins may include using the protective sidewall 221 and the patterned layer 230 as a mask to remove partial width of the first region 112 of the first fin and partial width of the first region 122 of the second fin along a direction perpendicular to the sidewalls of the fins.

In one embodiment, the first region 112 of the first fin and the first region 122 of the second fin may be partially removed by a wet etching process. The first region 112 of the first fin and the first region 122 of the second fin may be made of silicon, and the etching solution used in the wet etching process may be a tetramethylammonium hydroxide solution (TMAH solution). In other embodiments, the wet etching process may also employ an ammonium hydroxide (NH4OH) solution.

When removing partial width of the first region 112 of the first fin and the first region 122 of the second fin, the removal amount should neither be too little nor too much. If the removal amount is too little, too much material of the first region 112 of the first fin and too much material of the first region 122 of the second fin are left for a subsequent oxidation process. As a result, the remaining first region 112 of the first fin and the remaining first region 122 of the second fin may not be completely oxidized when subsequently forming the isolation structure. If the removal amount is too much, it is difficult for the remaining first region 112 of the first fin to support the second region 111 of the first fin and difficult for the first region 122 of the second fin to support the second region 121 of the second fin. As a result, the second region 111 of the first fin and the second region 121 of the second fin may collapse. Further, the top size of the first fin 110 (FIG. 4) is smaller than the bottom size of the first fin, and the top size of the second fin 120 (FIG. 4) is smaller than the bottom size of the second fin. In one embodiment, the removed amount of the partial width along the direction perpendicular to the sidewalls of the fins may be approximately 60%~70% of the top width of the first regions of the fins. In other words, the removed amount of the partial width of the first region 112 of the first fin may be approximately 60%~70% of the top width of the first region 112 of the first fin, and the removed amount of width of the first region 122 of the second fin may be approximately 60%~70% of the top width of the first region 122 of the second fin.

In order to simultaneously control the removed amount, the manufacturing efficiency, the etching stability, and the wet etching parameters should also be controlled within a suitable range. In one embodiment, the wet etching temperature may be in a range of approximately 20° C.~120° C., and the processing time may be in a range of approximately 20 s~500 s.

In one embodiment, after removing partial width of the first region 112 of the first fin and partial width of the first region 122 of the second fin, the fabrication method further includes removing the patterned layer 230 (FIG. 6) and the remaining filling layer 210 in the second NMOS region III (FIG. 6).

In one embodiment, the patterned layer 230 and the remaining filling layer 210 are removed by an ashing process. In other embodiments, the patterned layer and the remaining filling layer may also be removed by a wet etching process.

Figure 8:
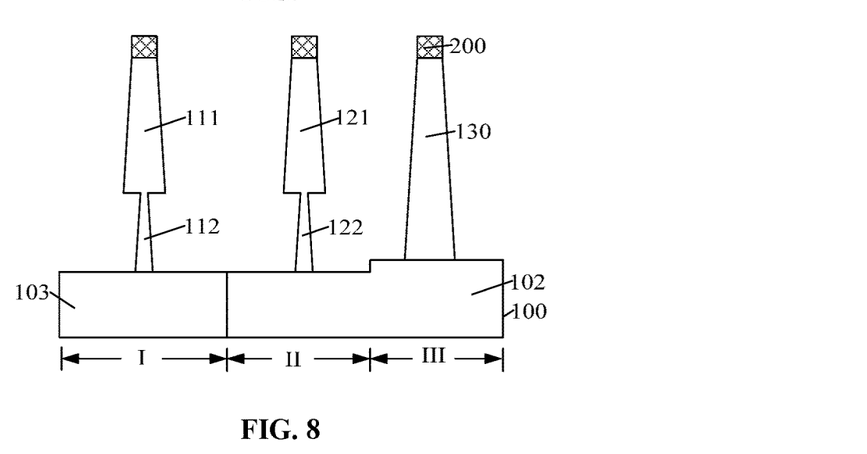

As shown in FIG. 8, the protective sidewalls 221 are removed from the second region 111 of the first fin, the second region 121 of the second fin, and the third fin 130.

In one embodiment, the protective sidewalls 221 may be removed by a wet etching process. The protective sidewalls 221 may be made of silicon nitride, and the etching solution for the wet etching process may include phosphoric acid.

In some embodiments, when etching the protective sidewalls 221, a portion of the first hard mask layer 200 may also be etched. Because the thickness of the first hard mask layer 200 on top of the fins is larger than the thickness of the protective sidewall 221, after removing the protective sidewalls 221, a portion of the first hard mask layer 200 may still remain on top of the fins.

Figure 9:
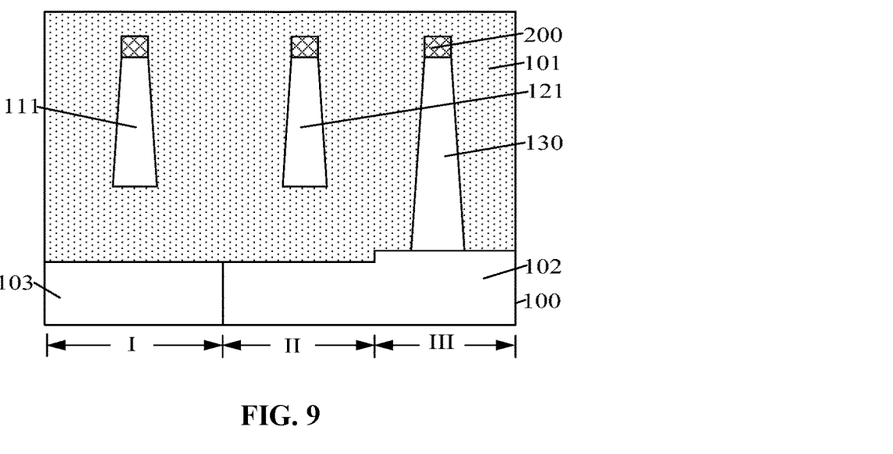
Figure 10:
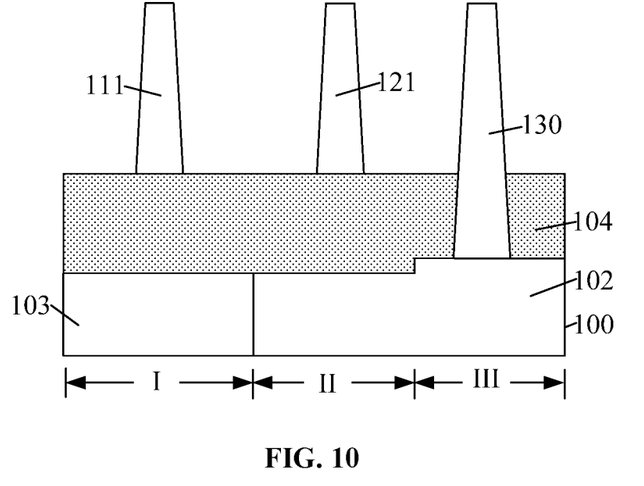

Returning to FIG. 15, after removing the protective sidewalls, an isolation structure is formed on the substrate between the adjacent second regions of the fins, with the remaining first regions of the fins being oxidized (S105). FIGS. 9 and 10 illustrate corresponding semiconductor structures.

As shown in FIGS. 9 and 10, an isolation structure 104 (FIG. 10) is formed on the substrate 100 between the neighboring second regions of the fins in an oxygen-containing atmosphere. The top surface of the isolation structure 104 is lower than the top surface of the second region of the fins, and the remaining first regions of the fins are oxidized in the oxygen-containing atmosphere.

As an isolation structure for the semiconductor structure, the isolation structure 104 is used to separate adjacent devices. In one embodiment, the isolation structure 104 may be made of silicon oxide. In other embodiments, the isolation structure may also be made of silicon nitride or silicon oxynitride.

For example, forming the isolation structure 104 on the substrate 100 between the adjacent second regions of the fins include: forming a precursor isolation film 101 (FIG. 9) on the substrate 100 between the adjacent fins by applying a flowable chemical vapor deposition (FCVD) process, with the top surface of the precursor isolation film higher than the top surface of the first hard mask layer 200; solidifying and annealing the precursor isolation film 101 to form an isolation film; adopting a planarization process to remove the isolation film that is higher than the top surface of the first hard mask layer 200; etching back a portion of the remaining isolation film to form the isolation structure 104, with the top surface of the isolation structure 104 lower than the top surface of the second regions of the fins; and removing the first hard mask layer 200.

Use of the flowable chemical vapor deposition (FCVD) process may allow the formed isolation structure 104 to be sufficiently filled at the corners around the fins. In other embodiments, the precursor isolation film may be formed using a high aspect ratio chemical vapor deposition (HARP CVD) process.

In one embodiment, the isolation structure 104 may be made of silicon oxide. The flowable chemical vapor deposition process includes: depositing a thin film precursor containing Si, H, N, and O on the substrate 100; subjecting the thin film precursor to the ultraviolet light irradiation to break the Si—H bond; after the ultraviolet light irradiation, applying the thin film precursor to a water vapor annealing treatment to make the Si and O react with each other and to form the precursor isolation film 101.

In one embodiment, the processing temperature for depositing the film precursor may be in a range of approximately 50° C.~90° C. The processing parameters of the water vapor annealing treatment include an annealing temperature in a range of approximately 400° C.~800° C. for an annealing time in a range of approximately 15 minutes~120 minutes. The solidifying and annealing process is a rapid thermal annealing process at an annealing temperature of approximately 900° C. to 1050° C., for an annealing time of approximately 10 minutes~40 minutes under one standard atmospheric pressure.

The water vapor annealing treatment of the thin film precursor may promote the reaction between O and the Si in the first region of the fins and to form silicon oxide. Because the width of the remaining first region of the fins along the direction perpendicular to the sidewalls of the fins is very small, the water vapor annealing treatment can completely oxidize the remaining first regions of the fins, so that the first regions of the fins made of silicon are oxidized to form silicon oxide and the resulting silicon oxide forms a portion of the subsequently formed isolation structure 104. Accordingly, after formation of the isolation structure 104, the second region 111 of the first fin and the second region 121 of the second fin are separately by the isolation structure 104.

In one embodiment, the isolation film above the top of the first hard mask layer 200 is removed by chemical mechanical polishing process. Partial width of the remaining isolation film may be etched back by wet etching, dry etching, or the combination of the wet etching and dry etching. The first hard mask layer 200 may be removed by wet etching. The first hard mask layer 200 may be made of silicon nitride, and the etching solution used in the wet etching process may include a phosphoric acid solution.

In one embodiment, the top surface of the isolation structure 104 is at the same level with the bottom surface of the second region of the fins after forming the isolation structure 104 by partially etching back the remaining isolation film. In other embodiments, the top surface of the isolation structure may also be above the bottom surface of the second regions of the fins, i.e., the isolation structure may also cover a portion of the sidewalls of the second regions of the fins.

Figure 11:
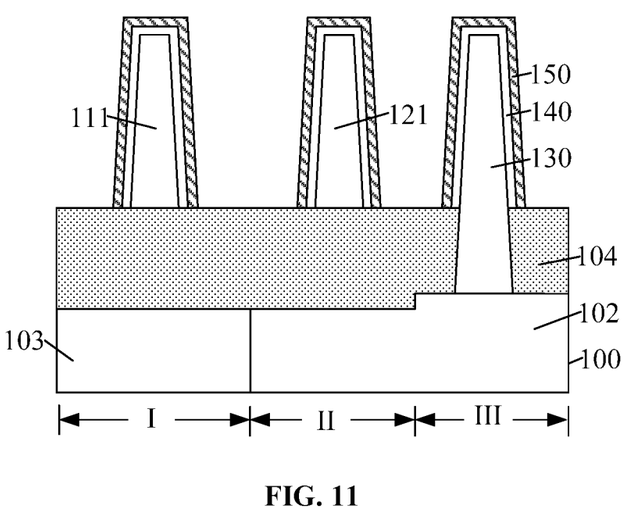
Figure 12:
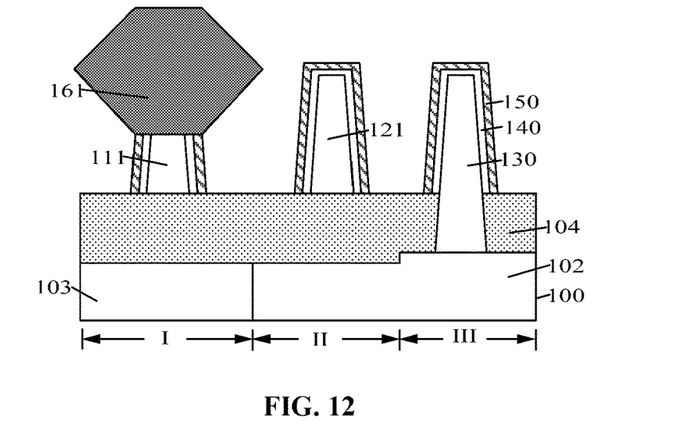
Figure 13:
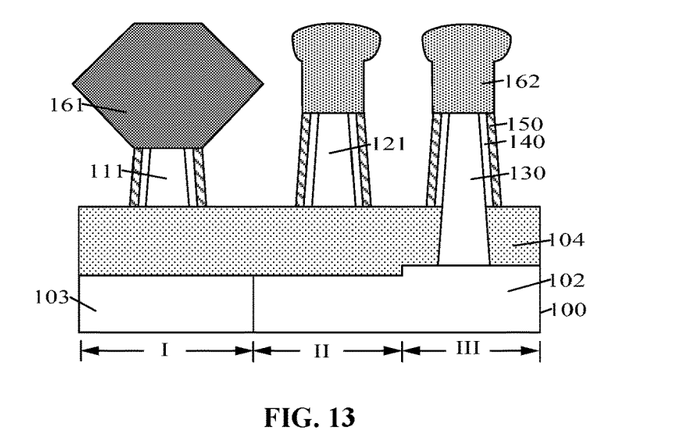
Figure 14:
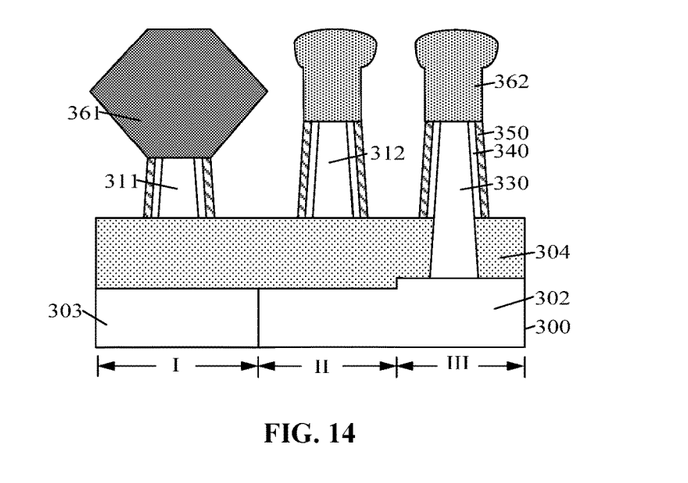
FIG. 14 illustrates a schematic cross-section view of an exemplary semiconductor structure consistent with the disclosed embodiments.

Returning to FIG. 15, a gate structure is subsequently formed (S106). FIG. 11 illustrates a corresponding semiconductor structure. Note that FIG. 11, together with FIGS. 12-14, illustrates a cross-section in the source/drain regions of the MOS devices of the disclosed device. The illustrated cross-section is perpendicular to a length direction of the fins.

As shown in FIG. 11, an oxide layer 140 is formed on top and sidewall surfaces of the fins. In one embodiment, a gate structure (not illustrated) is formed by forming a gate electrode layer (not illustrated) across the fins and covering a portion of the top and sidewall surfaces of the oxide layer 140. The oxide layer 140 may thus have the portion underlying the gate electrode layer to be used as a gate dielectric layer, and may also have another portion formed at least on sidewall surfaces of the fins that are uncovered by the gate electrode layer.

In one embodiment, the gate structure (not illustrated) is a dummy gate, and the gate structure occupies a space for the subsequent formation of a metal gate structure.

For example, forming the gate structure (not illustrated) include forming a dummy gate film across the fins and covering the top and sidewall surfaces of the fins on the isolation structure 104; forming a patterned second hard mask layer (not shown) on the surface of the dummy gate film, the second hard mask layer defining a pattern of the gate structure to be formed; using the second hard mask layer as a mask to pattern the dummy gate film and forming a gate structure on top of the isolation structure 104 in the PMOS region I, on top of the isolation structure 104 in the first NMOS region II, and on the top of the isolation structure 104 in the second NMOS region III; and removing the second hard mask layer.

For example, the gate structure (not illustrated) in the PMOS region I spans the second region 111 of the first fin and covers a portion of the top surface and sidewall surface of the second region 111 of the first fin; the gate structure (not illustrated) in the first NMOS region II spans the second region 121 of the second fin and covers a portion of the top surface and sidewall surface of the second region 121 of the second fin; and the gate structure (not illustrated) in the second NMOS region III spans the third fin 130 and covers a portion of the top surface and sidewall surface of the third fin 130.

The gate structure may be in a single layer structure or a stacked structure. The gate structure may include a dummy gate layer, or include a portion of the oxide layer 140 and a dummy gate layer on the portion of the oxide layer. The dummy gate layer may be made of polysilicon, silicon oxide, silicon, silicon oxynitride, silicon carbide, silicon carbonitride, silicon oxycarbide or amorphous carbon. The oxide layer 140 may be made of silicon oxide or silicon oxynitride.

In other embodiments, the gate structure may also be a metal gate structure. The gate structure may include a gate dielectric layer (e.g., a portion of the oxide layer or a later formed dielectric layer) and a gate electrode layer on the surface of the gate dielectric layer. The gate dielectric layer may be made of silicon oxide or other high-k gate dielectric materials and the gate electrode layer may be made of polycrystalline silicon or metal. The metal may include one or more of Ti, Ta, TiN, TaN, TiAl, TiAlN, Cu, Al, W, Ag, and Au.

After forming the gate structure, the fabrication method further includes forming a mask layer 150 on the top and sidewalls of the fins. The mask layer 150 is also located on the top and sidewalls of the gate structure and on the isolation structure 104.

The mask layer 150 may be formed using a chemical vapor deposition, a physical vapor deposition, or an atomic layer deposition. In one embodiment, the mask layer 150 is formed by an atomic layer deposition.

By forming the mask layer 150, on the one hand, when subsequently etching partial width of the second region 111 of the first fin on both sides of the gate structure in the PMOS region I, the mask layer 150 together with the underlying portion of the oxide layer 140 can protect the NMOS region; on the other hand, when subsequently applying the epitaxial growth technique in the second region 111 of the first fin on both sides of the gate structure in the MPOS region II, the mask layer 150 together with the underlying portion of the oxide layer 140, can protect the second region 121 of the second fin and the third fin 130, so that the epitaxial growth process will not occur in the second region 121 of the second fin and on the third fin 130.

The mask layer 150 and the fins can be made of different materials, and the mask layer can also be made of a material different from the isolation structure 104. In one embodiment, the mask layer 150 may be made of silicon nitride. In other embodiments, the mask layer may be made of silicon oxide, boron nitride, or silicon oxynitride.

Returning to FIG. 15, after forming a gate structure on the fins, a first source/drain doped region and a second source/drain doped region are formed (S107). FIG. 12 illustrates a corresponding semiconductor structure.

As shown in FIG. 12, a first source/drain doped region 161 is formed on the fins on both sides of the gate structure in the PMOS region I. In one embodiment, the first source/drain doped region 161 is formed in the second region 111 of the first fin on both sides of the gate structure in the PMOS region I.

For example, forming the first source/drain doped region 161 include: removing the mask layer 150 on top of the second region 111 of the first fin on both sides of the gate structure in the PMOS region I; removing partial thickness of the second region 111 of the first fin on both sides of the gate structure in the PMOS region I and forming a first trench (not shown) in the second region 111 of the first fin; forming a first stress layer within the first trench by a selective epitaxial growth; and forming the first source/drain doped region 161 in the first stress layer.

In one embodiment, the mask layer 150 is removed using a dry etching process. When etching to remove the mask layer 150, the mask layer on top of the gate structure in the PMOS region I and the mask layer on a portion of the isolation structure 104 are also removed. After exposing the top surface of the second region 111 of the first fin on both sides of the gate structure in the PMOS region I, partial thickness of the second region 111 of the first fin is further etched to from the first trench.

In one embodiment, in order to increase the volume of the first stress layer subsequently formed in the first trench, when etching the second region 111 of the first fin, the mask layer 150 on the sidewalls of the second region 111 of the first fin is also etched, so that after forming the first trench, the top surface of the mask layer 150 on the sidewall of the second region 111 of the first fin is levelled (coplanar) with the top surface of the second region 111 of the first fin.

In one embodiment, after forming the first stress layer, the first source/drain doped region 161 is formed by applying an ion doping process to the first stress layer. In one embodiment, the first stress layer may be made of SiGe or SiGeB, and the first stress layer may be in a "Σ" shape. The first stress layer provides a compressive stress for subsequently forming the channel region of the PU transistor in order to increase the carrier mobility of the PU transistor. When forming the first stress layer by ion doping, the doping ions may be P-type ions, such as B, Ga or In, and the top surface of the first source/drain doped region 161 is higher than the top surface of the first trench. In other embodiments, the first source/drain doped region may also be formed by in-situ self-doping of the P-type ions during the process of forming the first stress layer.

As shown in FIG. 13, a second source/drain doped region 162 is formed on the fins on both sides of gate structure in the NMOS region.

In one embodiment, the second source/drain doped region 162 is formed within the second region 121 of the second fin on both sides of the gate structure in the first NMOS region II, and within the third fin 130 on both sides of the gate structure in the second NMOS region III.

For example, forming the second source/drain doped region 162 include removing the mask layer 150 on top of the second region 121 of the second fin on both sides of the gate structure in the first NMOS region and removing the mask layer 150 on top of the third fin 130 on both sides of the gate structure in the second NMOS region III. Partial thickness of the second region 121 of the second fin and the third fin 130 is removed to form a second trench in the second region 121 of the second fin and in the third fin 130. A second stress layer is formed in the second trench by a selective epitaxial growth process. The second source/drain doped region 162 is formed in the second stress layer.

In one embodiment, the mask layer 150 may be removed by a dry etching process. The mask layer 150 on top of the gate structure in the first NMOS region II and the second NMOS region III and the mask layer 150 on top of a portion of the isolation structure 104 are etched. After the top of the second region 121 of the second fin on both sides of the gate structure in the first NMOS region II and the top of the third fin 130 on both sides of the gate structure in the second NMOS region III are exposed, the second region 121 of the second fin and the third fin 130 are further etched partially to form the second trench.

In one embodiment, in order to increase the volume of the second stress layer later formed in the second trench, when etching partial thickness of the second region 121 of the second fin and the third fin 130, the mask layer 150 on the sidewalls of the second region 121 of the second fin and the third fin 130 is also etched, so that after forming the second trench, the top surface of the mask layer 150 on the sidewalls of the second region 121 of the second fin and on the sidewalls of the third fin 130 are levelled with the top surface of the second region 121 of the second fin and with the top surface of the third fin 130.

In one embodiment, after forming the second stress layer, the second source/drain doped region 162 is formed by applying an ion doping process to the second stress layer. The second stress layer may be made SiC, SiP or SiCP, and the second stress layer may be in a "U" shape. The second stress layer provides a tensile stress for subsequently forming the channel region of the PD transistor and PG transistor, thereby enhancing the carrier mobility of the PD transistor and the PG transistor. When performing an ion doping process for the second stress layer, the doping ions are N-type ions, such as P, As or Sb. The top surface of the second source/drain doped region 162 is higher than the top surface of the second trench. In other embodiments, the second source/drain doped region may also be formed by in-situ self-doping of the N-type ions during the formation of the second stress layer.

In one embodiment, the first source/drain doped region 161 (FIG. 13) may be formed before formation of the second source/drain doped region 162 (FIG. 14). In other embodiments, the second source/drain doped region may also be formed prior to forming the first source/drain doped region.

In one embodiment, when forming the isolation structure 104 (FIG. 10), the first region 112 of the first fin (FIG. 8) and the first region 122 of the second fin (FIG. 8) are fully oxidized, and the silicon material is converted into the isolation structure 121 (FIG. 10). Thus, the second region 111 of the first fin and the second region 121 of the second fin, and the substrate 100 are separated by the isolation structure 104. That is, the second region 111 of the first fin and the N-type well region 103 (FIG. 10) are separated by the isolation structure, and the second region 131 of the second fin and the P-type well region 102 (FIG. 10) are separated by the isolation structure 104. After forming the first source/drain doped region 161 (FIG. 13) and the second source/drain doped region (FIG. 13), the isolation structure 104 may prevent punch-through between the first source/drain doped region 161 and the P-type well region 102 across the N-type well region 103, and prevent punch-through between the second source/drain doped region 162 and the N-type well region 103 across the P-type well region 102. Therefore, the isolation effect between the first source/drain doped region 161 and the P-type well region 102 and the isolation effect between the second source/drain doped region 162 and the N-type well region 103 are both enhanced, leading to an enhancement of the electrical performance of the semiconductor device.

As shown in FIG. 14, the present disclosure also provides a semiconductor structure, which includes: a substrate 300, and the substrate 300 includes the neighboring NMOS region and PMOS region; an N-type well region 303 located in the PMOS region I of the substrate 300; a P-type well region 302 located in the NMOS region of the substrate 300; an isolation structure 304 on the substrate 300; fins on the isolation structure 304; a gate structure (not illustrated) that spans the fins and covers a portion of the top surface and sidewall surface of the fins; a first source/drain doped region 361 located within the fins on both sides of the gate structure in the PMOS region I; a second source/drain doped region 362 located within the fins on both sides of the gate structure in the NMOS region.

In one embodiment, the semiconductor structure is an SRAM (Static Random Access Memory) transistor. The transistor located on the PMOS region I of the substrate 300 is a PU transistor. The NMOS region of the substrate 300 includes a second NMOS region III and a first NMOS region II located between the PMOS region I and the second NMOS region III. The transistor located on the first NMOS region II of the substrate 300 is a PD transistor and the transistor located on the second NMOS region III of the substrate 300 is a PG transistor.

Correspondingly, the fin on the PMOS region I of the substrate 300 is the first fin 311, the fin on the first NMOS region II of the substrate 300 is the second fin 312, and the fin on the second NMOS region III of the substrate 300 is the third fin 330.

In one embodiment, the substrate 300 may be made of silicon. In other embodiments, the substrate may be made of germanium, silicon germanium, silicon carbide, gallium arsenide or indium gallium, and the substrate can also be made of a silicon on insulator substrate or a germanium on insulator substrate.

The fins and the substrate 300 are made of the same material. In one embodiment, the fins are made of silicon, that is, the first fin 311, the second fin 312, and the third fin 330 are made of silicon. In other embodiments, the fins may be made of germanium, silicon germanium, silicon carbide, gallium arsenide or indium gallium.

The isolation structure 304, as an isolation structure for the semiconductor structure, can isolate adjacent devices. In one embodiment, the isolation structure 304 may be made of silicon oxide. In other embodiments, the isolation structure may also be made of silicon nitride or silicon oxynitride.

In one embodiment, the top surface of the isolation structure 304 is levelled with the bottom surface of the first fin 311 and the second fin 312. In other embodiments, the top surface of the isolation structure may be higher than the bottom surface of the first fin and the second fin, i.e. the isolation structure may also cover a portion of the sidewall of the first fin and the second fin.

In one embodiment, the first fin 311 and the second fin 312 are isolated from the substrate 300 by the isolation structure 304, i.e., the first fin 311 and the second fin 312 are not connected to the substrate 300. The third fin 330 is located within the isolation structure 304 and is connected to the substrate 300. The isolation structure 304 covers a portion of the sidewall of the third fin 330.

In one embodiment, the gate structure may be a metal gate structure. The gate structure includes a gate dielectric layer (e.g., including a portion of an oxide layer 340) and a gate electrode layer on the surface of the gate dielectric layer. The gate dielectric layer or the oxide layer 340 may be made of silicon oxide or high-k gate dielectric materials; the gate electrode layer may be made of polycrystalline silicon or a metal material, and the metal material may include one or more of Ti, Ta, TiN, TaN, TiAl, TiAlN, Cu, Al, W, Ag or Au.

For example, the gate structure in the PMOS region I spans the first fin 311 and covers a portion of the top surface and sidewall surface of the first fin 311. The gate structure in the first NMOS region II spans the second fin 312 and covers a portion of the top and sidewall surfaces of the second fin 312. The gate structure in the second NMOS region III spans the third fin 330 and covers a portion of the top and sidewall surfaces of the third fin 330.

The semiconductor structure further includes a mask layer 350 on the sidewall of the first fin 311, on the sidewall of the second fin 312, and on the sidewall of the third fin 330 on both sides of the gate structure. The mask layer 350 is used to protect the sidewall of the first fin 311, the sidewall of the second fin 312, and the sidewall of the third fin 330 during the process to form the first source/drain region 361 and the second source/drain doped regions 362, so that the epitaxial growth process will not occur on the sidewall of the first fin 311, on the sidewall of the second fin 312, and on the sidewall of the third fin 330.

The mask layer 350 and the fins are made of different materials, and the mask layer 350 and the isolation structure 304 can also be made of different materials. In one embodiment, the mask layer 350 may be made of silicon nitride. In other embodiments, the mask layer may be made of silicon oxide, boron nitride, or silicon oxynitride.

In one embodiment, the transistor located on the PMOS region I of the substrate 300 is a PU transistor, the transistor located on the first NMOS region II of the substrate 300 is a PD transistor, and the transistor located on the second NMOS region III of the substrate 300 is a PG transistor. The doping ions of the first source/drain doped region 361 are P-type ions, such as B, Ga, or In, and the doping ions of the second source/drain doped regions 362 are N-type ions, such as P, As, or Sb.

The semiconductor structure further includes a first stress layer (not shown) located in the first fin 311 on both sides of the gate structure in the PMOS region II, with the first source/drain doped region 361 being located in the first stress layer, and a second stress layer located in the second fin 312 on both sides of the gate structure in the first NMOS region II and the stress layer located in the third fin 330 on both sides of the gate structure in the second NMOS region III. The second source/drain doped region 362 is located within the second stress layer.

In one embodiment, the first stress layer may be made of SiGe or SiGeB, and the first stress layer may be in a "Σ" shape. The first stress layer provides a compressive stress for the channel region of the PU transistor so as to increase the carrier mobilities of the PU transistor. The second stress layer may be made of SiC, SiP or SiCP, and the second stress layer may be in a "U" shape. The stress layer provides a tensile stress for the channel regions of the PD transistor and PG transistor to increase the carrier mobilities of the PD transistor and PG transistor.

The substrate 300 in the NMOS regions may have a first surface portion in the NMOS region II and a second surface portion in the NMOS region III. In one embodiment, the first surface portion in the NMOS region II may have a top surface lower than the second surface portion in the NMOS region III, as shown in FIG. 14. In another embodiment, the first surface portion in the NMOS region II may have a top surface levelled with the second surface portion in the NMOS region III.

In one embodiment, the first fin 311 and the second fin 312 are located on the isolation structure 304, and the isolation structure 304 can separate the first fin 311 and the second fin 312 from the substrate 300. The isolation structure 304 can prevent punch-through between the first source/drain doped region 361 and the P-type well region 302 across the N-type well region 303, and prevent punch-through between the second source/drain doped region 362 and the N-type well region 303 across the P-type well region 302. Therefore, the isolation effect between the first source/drain doped region 361 and the P-type well region 302 and the isolation effect between the second source/drain doped region 362 and the N-type well region 303 are significantly enhanced, and the electrical performance of the semiconductor device can be improved.

Compared with the prior art, the fabrication method in the present disclosure is advantageous. For example, in the present disclosure, a protective sidewall covering partially the sidewall surface of each fin is formed. As a result, the lower portion of each fin exposed by the protective sidewall forms the first region of the fin and the unexposed upper portion of each fin forms the second region of the fin. Using the protective sidewall as a mask, partial width of the first region of the fin is removed along a direction perpendicular to the sidewall of the fin. When subsequently forming the isolation structure on the substrate between the neighboring fins, the isolation structure is formed in an oxygen-containing atmosphere by substantially oxidizing the remaining first region of the fin to make the oxidized first region as a portion of the isolation structure. Thus, the second region of the fins and the substrate can be separated by the isolation structure, that is, the second region of the fins and the N-type well region, and the second region of the fins and the P-type well region are separated by the isolation structure, respectively. After forming the first source/drain doped region on both sides of the gate structure of the fin in the PMOS region and forming the second source/drain doped region on both sides of the gate structure of the fins in the NMOS region, the isolation structure can prevent punch-through between the first source/drain doped region and the P-type well region across the N-type well region, and can prevent punch-through between the second source/drain doped region and the N-type well region across the P-type well region. That is, the isolation effect between the first source/drain doped region and the P-type well region and the isolation effect between the second source/drain doped region and the N-type well region are improved, so that the electrical performance of semiconductor devices can be improved.

The above detailed descriptions only illustrate certain embodiments of the disclosed disclosure, and are not intended to limit the scope of the disclosed disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method of forming a semiconductor structure, comprising:
    providing a substrate including an NMOS region and a PMOS region adjacent to the NMOS region, wherein the NMOS region includes a first NMOS region and a second NMOS region;
    forming a plurality of fins on the substrate, wherein the plurality of fins includes a first fin on the PMOS region, a second fin on the first NMOS region, and a third fin on the second NMOS region of the substrate;
    forming an N-type well in the PMOS region of the substrate and a P-type well in the NMOS region of the substrate;
    forming a protective sidewall to cover an upper portion of a sidewall surface of each fin in each of the NMOS region and PMOS region and to expose a lower portion of the sidewall surface of each fin;
    removing a partial width of the lower portion of the first fin and the second fin along a direction perpendicular to a sidewall of the first fin and the second fin using the protective sidewall as an etch mask;
    removing the protective sidewall; and
    forming an isolation structure at least by converting the remaining lower portion of the first fin and the second fin to be a part of the isolation structure, such that the third fin is through the isolation structure and the isolation structure is formed on the substrate, under and between neighboring upper portions of the first fin and the second fin, and having a top surface lower than the neighboring upper portions of the first fin and the second fin.

2. The method of forming a semiconductor structure according to claim 1, wherein:
    the protective sidewall is made of a material including silicon nitride, silicon carbide, silicon carbonitride, silicon oxynitride, silicon oxynitride, nitride boron, boronitride, or a combination thereof.

3. The method of forming a semiconductor structure according to claim 1, wherein:
    the protective sidewall has a thickness in a range of approximately 10 Å~60 Å.

4. The method of forming a semiconductor structure according to claim 1, wherein:
    a ratio between a height of the lower portion of the first fin and the second fin and a total height of the first fin and the second fin is in a range of approximately 20%~30%.

5. The method of forming a semiconductor structure according to claim 1, wherein:
    removing the partial width of the lower portion of the first fin and the second fin includes a wet etching process using an etching solution including one of a tetramethylammonium hydroxide solution and ammonium hydroxide solution.

6. The method of forming a semiconductor structure according to claim 5, wherein:
    when using the tetramethylammonium hydroxide solution, an etching temperature is in a range of approximately 20° C. 120° C. for an etching time in a range of approximately 20 s~500 s.

7. The method of forming a semiconductor structure according to claim 1, wherein:
    the removed partial width of the lower portion of the first fin and the second fin is in an amount of approximately 60%~70% of a top width of the lower portion of the first fin and the second fin.

8. The method of forming a semiconductor structure according to claim 1, wherein:
    the isolation structure is made of a material including silicon oxide, silicon nitride, silicon oxynitride, or a combination thereof.

9. The method of forming a semiconductor structure according to claim 1, wherein forming the isolation structure includes:
    forming a precursor isolation film on the substrate and between the neighboring upper portions of the first fin and the second fin using a flowable chemical vapor deposition, the precursor isolation film having a top surface higher than the upper portions of the first fin and the second fin;
    forming an isolation film by annealing to solidify the precursor isolation film;
    removing a portion of the isolation film higher than a top surface of the upper portions of the first fin and the second fin; and
    removing a thickness portion of the remaining isolation film to expose a sidewall surface of the upper portions of the first fin and the second fin.

10. The method of forming a semiconductor structure according to claim 9, wherein:
    the isolation structure is made of silicon oxide, and the flowable chemical vapor deposition includes depositing a thin film precursor containing Si, H, N and O on the substrate between the first fin and the second fin;
    treating the thin film precursor by ultraviolet light; and
    water vapor annealing the thin film precursor to form the precursor isolation film.

11. The method of forming a semiconductor structure according to claim 1, wherein:
    the PMOS region of the substrate is used to form a pull-up (PU) transistor, the first NMOS region is used to form a pull-down (PD) transistor and the second NMOS region is used to form a pass gate (PG) transistor, and the first NMOS region is located between the PMOS region and the second NMOS region.

12. A method of forming a semiconductor structure, comprising:
    providing a substrate including an NMOS region and a PMOS region adjacent to the NMOS region, wherein the NMOS region includes a first NMOS region and a second NMOS region;
    forming a plurality of fins on the substrate, wherein the plurality of fins includes a first fin on the PMOS region, a second fin on the first NMOS region, and a third fin on the second NMOS region of the substrate;
    forming an N-type well in the PMOS region of the substrate and a P-type well in the NMOS region of the substrate;
    forming a protective sidewall to cover an upper portion of a sidewall surface of each fin in each of the NMOS region and PMOS region and to expose a lower portion of the sidewall surface of each fin, wherein forming the protective sidewall includes:
        forming a filling layer on the substrate between the first fin and the second fin with the filling layer covering a lower portion of sidewalls of the first fin and the second fin;

forming a protective film covering top surfaces and sidewalls of the first fin and the second fin and on the filling layer;

forming a patterned layer on the protective film in the second NMOS region;

using the patterned layer as a mask to remove portions of the protective film that are on the top surface of the first fin and second fin and on the filling layer, the remaining protective film being the protective sidewall; and removing the exposed filling layer to expose the lower portions of the first fin and second fin, wherein the protective sidewall is on the upper portions of the first fin and second fin;

removing a partial width of the lower portion of the first fin and the second fin along a direction perpendicular to a sidewall of the first fin and the second fin using the protective sidewall as an etch mask;

removing the protective sidewalk; and forming an isolation structure at least by oxidizing the remaining lower portion of the first fin and the second fin, such that the isolation structure is formed on the substrate, under and between neighboring upper portions of the first fin and the second fin, and having a top surface lower than the neighboring upper portions of the first fin and the second fin.

13. The method of forming a semiconductor structure according to claim 12, wherein the filling layer is one of an organic dielectric layer, a bottom anti-reflection layer, and a photoresist layer.

14. The method of forming a semiconductor structure according to claim 12, wherein forming the protective film includes an atomic layer deposition.

15. The method of forming a semiconductor structure according to claim 14, wherein:

the protective sidewall is made of silicon nitride, and the atomic layer deposition uses:

a precursor containing Si and N, a processing temperature in a range of approximately 400° C.~600° C., a pressure in a range of approximately 1 mTorr~10 mTorr, a total gas flow of the precursor in a range of approximately 1500 sccm~4000 sccm, and repeated deposition for approximately 15~100 times.

16. The method of forming a semiconductor structure according to claim 12, wherein removing the partial width of the lower portion of the first fin and the second fin includes:

using the protective sidewall and the patterned layer as a mask to remove the partial width of the lower portion of the first fin and the second fin along the direction perpendicular to the sidewall of the first fin and the second fin, prior to removing the patterned layer and the remaining filling layer.

17. The method of forming a semiconductor structure according to claim 12, wherein:

the protective sidewall is made of a material including silicon nitride, silicon carbide, silicon carbonitride, silicon oxynitride, silicon oxynitride, nitride boron, boronitride, or a combination thereof.

18. The method of forming a semiconductor structure according to claim 12, wherein:

the protective sidewall has a thickness in a range of approximately 10 Å~60 Å.

19. The method of forming a semiconductor structure according to claim 12, wherein:

a ratio between a height of the lower portion of the first fin and the second fin and a total height of the first fin and the second fin is in a range of approximately 20%~30%.

20. The method of forming a semiconductor structure according to claim 12, wherein:

removing the partial width of the lower portion of the first fin and the second fin includes a wet etching process using an etching solution including one of a tetramethylammonium hydroxide solution and ammonium hydroxide solution.

* * * * *